United States Patent
Yamashita

(10) Patent No.: US 7,365,603 B2
(45) Date of Patent: Apr. 29, 2008

(54) FET AMPLIFIER, PULSE MODULATION MODULE, AND RADAR DEVICE

(75) Inventor: Sadao Yamashita, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 366 days.

(21) Appl. No.: 10/558,778

(22) PCT Filed: Feb. 23, 2005

(86) PCT No.: PCT/JP2005/002852

§ 371 (c)(1),
(2), (4) Date: Nov. 30, 2005

(87) PCT Pub. No.: WO2005/091496

PCT Pub. Date: Sep. 29, 2005

(65) Prior Publication Data
US 2006/0244538 A1    Nov. 2, 2006

(30) Foreign Application Priority Data
Mar. 23, 2004    (JP)    ............................... 2004-085504

(51) Int. Cl.
*H03F 3/04*    (2006.01)
*G01S 7/28*    (2006.01)

(52) U.S. Cl. ...................... 330/296; 342/175; 342/202; 342/203; 342/204; 342/134

(58) Field of Classification Search ............... 342/175, 342/131, 132, 134, 135, 200–204; 323/282, 323/283; 324/117 R; 330/253, 264, 285, 330/296, 51
See application file for complete search history.

(56) References Cited

U.S. PATENT DOCUMENTS 3,624,533 A * 11/1971 Schiff ........................ 330/253

(Continued)

FOREIGN PATENT DOCUMENTS

DE        196 04 239 A1    8/1996

(Continued)

OTHER PUBLICATIONS

International Search Report for PCT Application No. PCT/JP2005/002852. International filing date, Feb. 23, 2005.

(Continued)

*Primary Examiner*—John B Sotomayor
(74) *Attorney, Agent, or Firm*—Keating & Bennett, LLP

(57) ABSTRACT

An FET amplifier includes an FET for amplifying a high-frequency signal to be input to the gate on the basis of a gate bias voltage from a gate bias control circuit. In the FET amplifier, a high-frequency signal input circuit and the output portion of an inverting amplifier are made conductive to the gate of the FET. A voltage stabilizing circuit generating a positive DC constant-voltage signal is made conductive to the non-inverting input portion of the inverting amplifier, and a gate bias control signal input circuit is made conductive to the inverting input portion through an inverter circuit. When the output voltage from the inverter circuit is 0 V, the inverting amplifier outputs a positive gate bias voltage (in the High state) and, when the output voltage from the inverter circuit is a fixed positive voltage, the inverting amplifier outputs a negative gate bias voltage (in the Low state) lower than the pinch-off voltage of the FET. The FET is ON/OFF controlled by the gate bias voltage and pulse modulates the input high-frequency signal to output the signal.

4 Claims, 1 Drawing Sheet

U.S. PATENT DOCUMENTS

| | | | |
|---|---|---|---|
| RE31,749 E * | 11/1984 | Yamashiro | 330/264 |
| 4,524,335 A * | 6/1985 | Yokoyama | 332/110 |
| 4,896,372 A * | 1/1990 | Weaver | 455/108 |
| 5,278,517 A | 1/1994 | Fujita | |
| 6,169,449 B1 * | 1/2001 | Hasegawa | 330/51 |
| 6,965,220 B2 * | 11/2005 | Kernahan et al. | 323/283 |
| 7,084,706 B2 | 8/2006 | Minichshofer | |
| 7,239,115 B2 * | 7/2007 | Chapuis et al. | 323/282 |
| 2004/0124923 A1 * | 7/2004 | Sato et al. | 330/285 |
| 2005/0073294 A1 * | 4/2005 | Baxter et al. | 324/117 R |
| 2006/0244538 A1 * | 11/2006 | Yamashita | 330/296 |

FOREIGN PATENT DOCUMENTS

| | | |
|---|---|---|
| DE | 103 05 366 A1 | 8/2004 |
| EP | 0 488 385 A1 | 6/1992 |
| JP | 58-073210 | 5/1983 |
| JP | 62-117824 | 7/1987 |
| JP | 63-269815 | 11/1988 |
| JP | 05-083041 | 4/1993 |
| JP | 11-195935 | 7/1999 |
| JP | 2001-068948 | 3/2001 |
| JP | 2001-217706 | 8/2001 |

OTHER PUBLICATIONS

Official communication issued in the corresponding German Application No. 11 2004 001 202.3-35, mailed on Feb. 19, 2007.

* cited by examiner

FET AMPLIFIER, PULSE MODULATION MODULE, AND RADAR DEVICE

BACKGROUND OF THE INVENTION

1. Field of the Invention

The present invention relates to an FET amplifier for amplifying a high-frequency signal, particularly an FET amplifier controlled by a gate bias control signal, a pulse modulation module for pulse modulating a high-frequency signal by using the FET amplifier, and a radar device for detecting a target by transmitting a pulse modulation signal from the pulse modulation module to the outside.

2. Description of the Related Art

As a device for detecting the distance to a target of a second vehicle existing in front of a first vehicle, etc., and the speed of the target, various millimeter wave radar devices are utilized and, among them, there are radar devices using an amplitude pulse modulation system. In a millimeter wave radar device using an amplitude pulse modulation system, a pulse modulation signal is generated and radiated by changing the amplitude of a high-frequency signal of a fixed frequency by an ON/OFF controlled signal. Then, the millimeter wave radar device detects the distance to a target based on the time difference between the transmission signal and the reception signal by receiving a reflected signal from the target. In the millimeter wave radar device using such an amplitude pulse modulation system, an RF switch for making a high-frequency signal intermittent by using an ON/OFF control signal or an amplifier for controlling and amplifying an amplitude is required.

There is such an amplifier having the structure as described above in Japanese Unexamined Patent Application Publication No. 5-83041. Although the circuit in Japanese Unexamined Patent Application Publication No. 5-83041 is an amplifier for portable telephones, an amplifier used in millimeter wave radars also has substantially the same structure. This type of amplifier contains an FET, a stabilized negative voltage generation circuit, and a gate bias control circuit for generating a control signal of the FET. The gate bias control circuit contains a ROM in which the gate bias control data is stored, a D/A converter for converting a control data output from the ROM to an analog control signal, and an inverting amplifier in which an analog voltage from the D/A converter and a negative voltage from the stabilized negative voltage generation circuit are input to generate a negative gate bias voltage. Then, the FET is controlled in accordance with a gate bias control signal, which is controlled based on the intensity of a receiving signal or the command from the base station, and the output power is optimized by changing the amplification degree of a high-frequency signal input to the gate.

Furthermore, in Japanese Unexamined Patent Application Publication No. 11-195935, a circuit for obtaining a desired gate bias voltage by dividing a voltage using resistors is shown. In the circuit, a depletion-type FET is ON/OFF controlled by making the pinch-off voltage of the FET a threshold voltage of the gate bias voltage. Thus, a pulse modulated high-frequency signal is output.

When a millimeter-wave band signal is amplified using a depletion-type FET, the maximum output can be often obtained by setting the gate bias voltage of the FET about +0.2 V.

However, in the related amplifiers, since the gate bias voltage of the FET is always negative, it is not able to output a millimeter wave signal having a sufficient amplitude from the FET.

Furthermore, a stable gate bias voltage of a fixed amplitude is required in order that the FET in the ON state may perform a stable high output operation. However, in the related amplifiers, since the fixed gate bias voltage for making the FET in the ON state (making the FET have a large output amplitude) is generated by using the output voltage of a D/A converter, the gate bias voltage becomes unstable by the effect of variation of the power supply voltage of the D/A converter. Thus, the amplitude of a millimeter wave signal output from the FET also becomes unstable. Furthermore, as in Japanese Unexamined Patent Application Publication No. 11-195935, when a gate bias voltage is obtained by dividing a voltage by resistors, since the capacitance (capacitor) connected in parallel to the gate bias circuit and the resistors for voltage division constitute an integration circuit, a sharp waveform necessary for a high-speed pulse modulation cannot be obtained.

SUMMARY OF THE INVENTION

In order to overcome the problems described above, preferred embodiments of the present invention provide an FET amplifier stabilizing the amplitude of a pulse modulation signal and providing a high output, a pulse modulation module having the FET amplifier in which a high-speed pulse operation can be performed, and a radar device having the FET amplifier and the pulse modulation module.

According to a preferred embodiment of the present invention, an FET amplifier includes an FET for amplifying a high-frequency signal to be input to the gate on the basis of a gate bias voltage from a gate bias control circuit, and the gate bias control circuit includes a voltage stabilizing circuit that generates a positive DC constant voltage signal, a logical circuit that outputs a state control signal in a High state or in a Low state, and an inverting amplifier that receives a positive DC constant voltage signal input from the voltage stabilizing circuit at the non-inverting input portion of the inverting amplifier and receives the state control signal input from the logical circuit at the inverting input portion of the inverting amplifier to output the gate bias voltage.

In the construction, the gate bias voltage output from the inverting amplifier is determined by a fixed positive DC constant voltage, a fixed voltage of a state signal corresponding to a gate bias control signal in a High state or in a Low state, and a constant determining the difference calculation (difference calculation determining constant), that is, an element value of an element connected to the differential amplifier of the inverting amplifier. The switching operation of the FET is performed in accordance with the gate bias voltage, and the amplitude of a high-frequency signal is ON/OFF controlled to output the signal. Here, a positive constant voltage is input to the non-inverting input portion of the inverting amplifier and a fixed voltage corresponding to the gate bias control signal is input to the inverting input portion, and thus, based on a fixed positive voltage, a voltage corresponding to the High and Low states of the gate bias control signal is determined in accordance with the difference calculation determining constant and output as a gate bias voltage. At this time, when the positive constant voltage value, the voltage value corresponding to each state of the gate bias control signal, and the difference calculation determining constant are set at fixed values, the FET can be turned on by the positive gate bias voltage. In this way, when the FET is in the ON state, a high output can be obtained.

Furthermore, according to the FET amplifier of a preferred embodiment of the present invention, the gate bias control circuit generates a positive gate bias voltage when a state control signal from the logical circuit is in the Low state, and generates a negative gate bias voltage when a state control signal from the logical circuit is in the High state.

In this unique construction, when a positive DC constant voltage and a fixed state signal voltage corresponding to the gate bias control signal in the Low state are input to the inverting amplifier, a positive gate bias voltage is generated to turn on the FET. Here, since a positive DC constant voltage input to the non-inverting input portion is input from a constant-voltage power supply, the voltage is stabilized, and, since a fixed voltage corresponding to the gate bias control signal input to the inverting input portion is 0 V in the Low state, the voltage in not affected by variation of the power supply voltage and is stable, and, as a result, the gate bias voltage output from the inverting amplifier is stable. Accordingly, the stable operation of the FET in the On state can be obtained.

On the other hand, when a positive DC constant voltage and a fixed state signal voltage corresponding to the gate bias control signal in the High state are input to the inverting amplifier, a negative gate bias voltage lower than the pinch-off voltage is generated to turn off the FET. Here, since the fixed voltage corresponding to the gate bias control signal input to the inverting input portion varies by the effect of variation of the power supply voltage, the gate bias voltage output from the inverting amplifier also varies in accordance with the change. However, when the gate bias voltage is set so as to be sufficiently lower than the pinch-off voltage, even if the power supply voltage varies a little, the variation of the FET in the OFF state is not affected.

Furthermore, a pulse modulation module according to another preferred embodiment of the present invention includes an FET amplifier, and the pulse modulation module pulse-modulates a high-frequency signal input to the FET on the basis of the gate bias voltage.

In this unique construction, since the FET amplifier is stable and is ON/OFF operated at high speed, the amplitude of a high-frequency signal input to the FET can be stably ON/OFF controlled in a pulse shape and a pulse modulation signal having no dull waveform and no distortion can be output.

Furthermore, a radar device according to yet another preferred embodiment of the present invention includes a pulse modulation module, and the radar device detects a target by externally transmitting a pulse modulation signal, which is produced by pulse-modulating a high-frequency signal in the pulse modulation module, and by receiving a reflection signal from the target.

In this unique construction, when the pulse modulation module is used, the waveform as a pulse modulation signal does not become dull and is not distorted.

According to various preferred embodiments of the present invention, the FET is turned on by application of a positive gate bias voltage, and the FET can be turned off by application of a negative gate bias voltage lower than the pinch-off voltage. Thus, an FET amplifier in which, while the FET is turned on, a high output is available can be constructed.

Furthermore, according to various preferred embodiments of the present invention, since the FET both in the On state and in the OFF state can be stably operated, an FET in which a stable high-frequency output signal is available can be constructed.

Furthermore, according to various preferred embodiments of the present invention, when the FET amplifier is used, a pulse modulation module in which a stable pulse modulation signal is output by controlling the amplitude of a high-frequency signal input to the FET in the ON and OFF states at high speed by the gate bias voltage can be constructed.

Furthermore, according to various preferred embodiments of the present invention, when the pulse modulation module is used and a signal input to the FET is made a high-frequency signal for detecting a target, a transmission signal which is a pulse modulation signal, that is, the ON/OFF controlled amplitude of the high-frequency signal is obtained and the detection of a target can be performed by using the transmission signal.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

A pulse modulation module including an FET amplifier according to a first preferred embodiment of the present invention is described with reference to FIG. 1.

Figure 1:
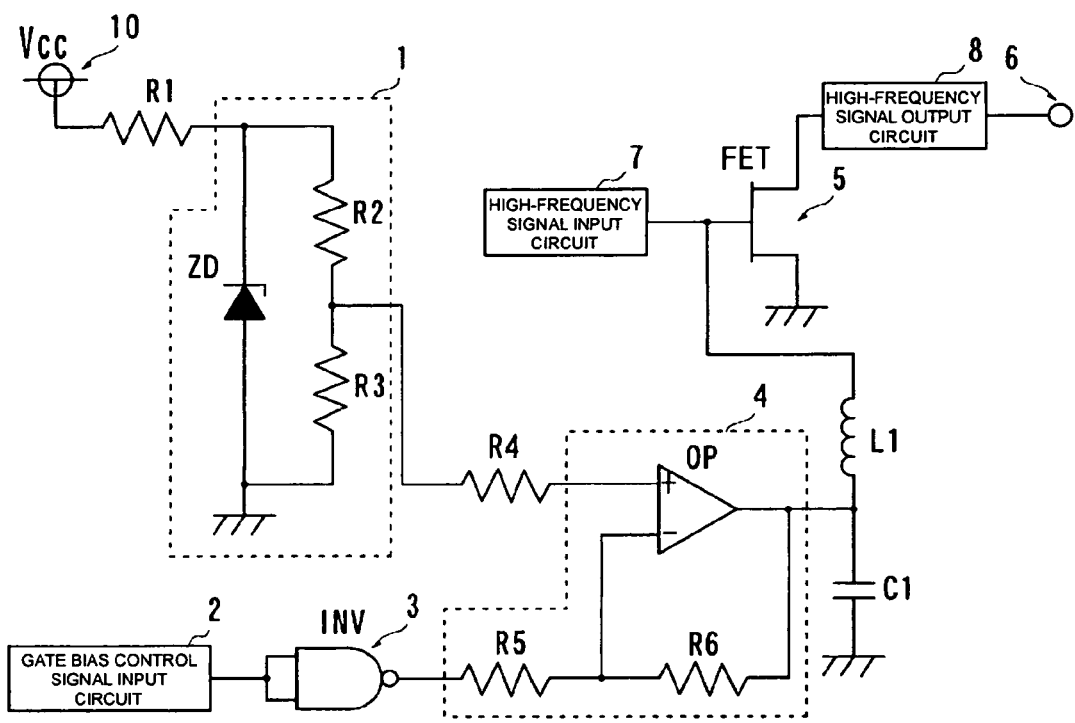
FIG. 1 is the circuit diagram of a pulse modulation module according to a first preferred embodiment of the present invention.

FIG. 1 is the circuit diagram of a pulse modulation module according to the present preferred embodiment.

As shown in FIG. 1, the gate of a depletion-type FET 5 in the pulse modulation module is made conductive to a high-frequency signal input circuit 7 and to the output portion of an inverting amplifier through an inductor L1. Furthermore, the source of the FET 5 is grounded and the drain is made conductive to a module signal output terminal 6 through a high-frequency signal output circuit 8.

The inverting amplifier 4 preferably includes an operational amplifier (differential amplifier) OP, a resistance element R6 connected between the inverting input terminal and the output terminal, and a resistance element R5 connected between the connection point of the inverting input terminal and the resistance element R6 and the output terminal of an inverter circuit INV3 corresponding to a logical circuit of the present invention in the front stage. Then, the non-inverting input terminal of the operational amplifier OP corresponds to the non-inverting input portion of the inverting amplifier 4, and the terminal portion, opposite to the resistance element R5, of the operational amplifier OP corresponds to the inverting input portion of the inverting amplifier 5. Moreover, the connection point between the output terminal of the operational amplifier OP and the resistance element R6 corresponds to the output portion of the inverting amplifier 4, and the output portion of the inverting amplifier 4 is grounded through a capacitor C1 having a small capacitance regarding high-frequencies.

The non-inverting input portion of the inverting amplifier 4, that is, the non-inverting input terminal of the operational amplifier OP is made conductive to the output portion of a voltage stabilizing circuit 1 through a resistance element R4.

The input portion of the voltage stabilizing circuit 1 is made conductive to a drive voltage input terminal 10 through a resistance element R1, and the voltage stabilizing circuit 1 preferably includes a Zener diode ZD having the cathode on the side of the input portion being connected between the input portion and the ground and a series circuit of resistance elements R2 and R3 connected in parallel to the Zener diode ZD. Then, the connection point between the resistance elements R2 and R3 corresponds to the output portion of the voltage stabilizing circuit 1.

The inverting input portion of the inverting amplifier 4 is made conductive to the output terminal of the inverter circuit 3, and the input terminal of the inverter circuit 3 is made conductive to a gate bias control signal input circuit 2.

A circuit including the voltage stabilizing circuit 1, gate bias control signal input circuit 2, inverter circuit 3, inverter amplifier 4, FET 5, and modulation signal output terminal 6 corresponds to an FET amplifier of the present invention.

Next, the operation of the pulse modulation module is described.

When a drive voltage signal Vcc having a voltage higher than the breakdown voltage VZD of the Zener diode ZD is input to the drive voltage input terminal 10, the drive voltage signal Vcc is input to the voltage stabilizing circuit 1 through the resistance element R1. When the drive voltage signal Vcc is applied to the voltage stabilizing circuit 1, a desired current flows through the resistance element R1 and a voltage obtained by subtracting a voltage drop in accordance with the current of the drive voltage signal Vcc and the resistance value of the resistance element R1 from the drive voltage signal Vcc is applied to the Zener diode ZD. Since the Zener diode ZD has a characteristic in that, even if the current flowing in the Zener diode ZD changes, the voltage across the Zener diode ZD is constant, the breakdown voltage VZD of a constant positive voltage is applied to the series circuit of the resistance elements R2 and R3. Then, the breakdown voltage VZD is divided by the resistance elements R2 and R3 and a desired positive DC constant voltage signal is output from the voltage stabilizing circuit 1. The positive DC constant-voltage signal is input to the non-inverting input portion of the non-inverting amplifier 4, that is, the non-inverting input terminal of the operational amplifier OP through a resistance element R4.

In the gate bias control signal input circuit 2, a digital gate bias control data signal for controlling the ON/OFF state, input from the front stage (not illustrated), is input, the processing of waveform formation, timing adjustment, etc., is performed, and the conversion to a gate bias control signal is performed to output the signal to the inverter circuit 3. Here, the gate bias control signal in the High state turns on the FET 5 and the gate bias control signal in the Low state turns off the FET 5.

The inverter circuit 3 has a circuit construction which can be realized by using a NAND gate as a logical circuit and the gate bias control is input to both of the two input terminals to output the inversion signal. The inversion signal output corresponds to a state control signal of the present invention. That is, when the gate bias control signal is in the High state, the inverter circuit 3 outputs a Low state voltage of 0 V, and, when the gate bias control signal is in the Low state, the inverter circuit 3 outputs a High state voltage of a fixed potential in accordance with the power supply voltage of the inverter 3. The voltage is input to the inverting input portion of the inverting amplifier 4 and input to the inverting input terminal of the operational amplifier OP through the resistance element R5.

The inverting amplifier 4 outputs a gate bias voltage having the relationship shown in the following formula in accordance with a positive DC constant voltage input to the non-inverting input portion and an output voltage from the inverter circuit 3, input to the inverting input portion. In the following formula, VG represents a gate bias voltage, VD represents a positive DC constant voltage, Vcon represents an output voltage from the inverter circuit 3, and R5 and R6 represent the resistance value of the resistance elements R5 and R6, respectively.

$$VG = -(R6/R5) \times Vcon + VD \qquad (1)$$

Here, VD is set by the structure of the voltage stabilizing circuit 1, and Vcon is set by the structure of the inverter circuit 3. Accordingly, the gate bias voltages corresponding to the High state and Low state can be set by setting the voltage values and the resistance values of the resistance elements R5 and R6 to fixed values.

For example, the positive DC constant-voltage value VD is set to about +0.2 V, the resistance value of the resistance element R5 is preferably set to about 1.2 k$\Omega$, and the resistance value of the resistance element R6 is preferably set to about 470$\Omega$. Then, the voltage value Vcon (High), corresponding to the High state, of the output voltage from the inverter circuit 3 is set to about +5 V, and the voltage value corresponding to the Low state is set at about 0 V. Thus, from the relationship shown in formula (I), the voltage value VG (High) in the High state of the gate bias control voltage becomes +0.2 V (=$-(470/1200) \times 0 + 0.2$), and the voltage value VG (Low) in the Low state of the gate bias control voltage becomes about $-1.76$ V (=$-(470/1200) \times 5.0 + 0.2$).

In this way, by setting the voltage values and the resistance values to desired values when the gate bias control signal is in the High state, the positive gate bias voltage is applied to the gate of the FET 5, and, when the gate bias control signal is in the Low state, the negative gate bias voltage is applied to the gate of the FET 5.

Since the FET 5 is ON/OFF controlled using the pinch-off voltage of a fixed negative voltage as a threshold value, the FET 5 can be turned off by setting the gate bias voltage in the Low state of the gate bias control signal to a lower value than the pinch-off voltage. For example, when the setting conditions of the former example are used, an FET having a pinch-off voltage of about $-1.5$ V may be used. Furthermore, on the contrary, when an FET having a pinch-off voltage of $-1.5$ V is used, elements and voltages meeting the conditions set of the former example may be used.

Since a high-frequency signal is input to the gate of the FET 5 from the high-frequency signal input circuit 7, when a gate bias control signal in the High state is input, the FET 5 is in the ON state, amplifies the high-frequency signal by a fixed amplification factor, and outputs the amplified signal to the modulation signal output terminal 6 through the high-frequency signal output circuit 8. At this time, since the FET 5 operates in a positive voltage region, the FET 5 can amplify the high-frequency signal by a high amplification factor. That is, a high output FET amplifier can be realized.

On the other hand, even if a high-frequency signal is input to the gate of the FET 5 from the high-frequency signal input circuit 7, when a gate bias control signal in the Low state is input, the FET 5 is not turned on and does not output a high frequency signal to the modulation signal output terminal 6.

In this way, the FET 5 can control the amplitude of a high-frequency signal by changing the High and Low states of the gate bias control signal as if ON/OFF controlled, and a high output pulse modulation signal can be output to the modulation signal output terminal 6.

Furthermore, in the above-described structure, the output voltage from the inverter circuit 3 corresponding to the gate bias control signal in the High state becomes 0 V and is not affected by variation of the power supply voltage of the inverter circuit 3. Thus, since 0 V is input to the inverting input terminal of the inverting amplifier 4 and a constant voltage from the voltage stabilizing circuit 1 is input to the non-inverting input terminal, the gate bias voltage in the High state is stabilized. Since this stable gate bias control voltage is applied to the FET 5, the FET 5 is stably ON controlled and the amplitude of the output pulse modulation signal is stabilized. Furthermore, since the output voltage from the inverter circuit 3 to the gate bias control signal in the Low state generally becomes the power supply voltage of the inverter circuit 3, the output voltage value from the inverter circuit 3 becomes a little unstable due to the variation of the power supply voltage. Because of this, although the gate bias voltage also changes, when the gate bias voltage in the Low state is set to be sufficiently lower than the pinch-off voltage of the FET 5, even if the power supply voltage of the inverter circuit 3 varies to some extent, the FET 5 is stably OFF controlled.

In this way, when the above-described structure is used, an FET amplifier and pulse modulation module for outputting a stable pulse modulation signal can be constructed. That is, an FET amplifier in which a high output and stable pulse modulation signal can be obtained and a pulse modulation module having the FET amplifier can be constructed.

Furthermore, in the above-described structure, since the output of the operational amplifier OP of the inverting amplifier 4 is directly input to the gate of the FET, the switching between High and Low states in accordance with the through rate performance of the operational amplifier can be performed at high speed. Thus, the FET 5 can be ON/OFF controlled at high speed and a high-speed pulse modulation can be realized with a sharp edge portion of the pulse in the pulse modulation signal to be output.

Furthermore, in the above-descried structure, since a voltage input to the inverting input portion of the inverting amplifier 4 is produced by inverting a gate bias control signal by the inverter circuit 3, the direction of change of the state of the gate bias control signal is in agreement with the direction of change of the state of the gate bias voltage. That is, when the gate bias control signal is in the High state, the gate bias voltage becomes positive and the FET 5 is turned on. Furthermore, when the gate bias control signal is in the Low state, the gate bias voltage becomes negative and the FET 5 is turned off. Thus, the High and Low states of the gate bias control data to be set in advance are in agreement with the sign of the gate bias voltage showing the ON/OFF control of the FET, the timing of the High and Low states of the pulse modulation signal can be easily designed, and a pulse modulation module easy to handle can be constructed.

Next, an amplitude pulse modulation radar device according to a second preferred embodiment is described with reference to FIG. 2.

Figure 2:
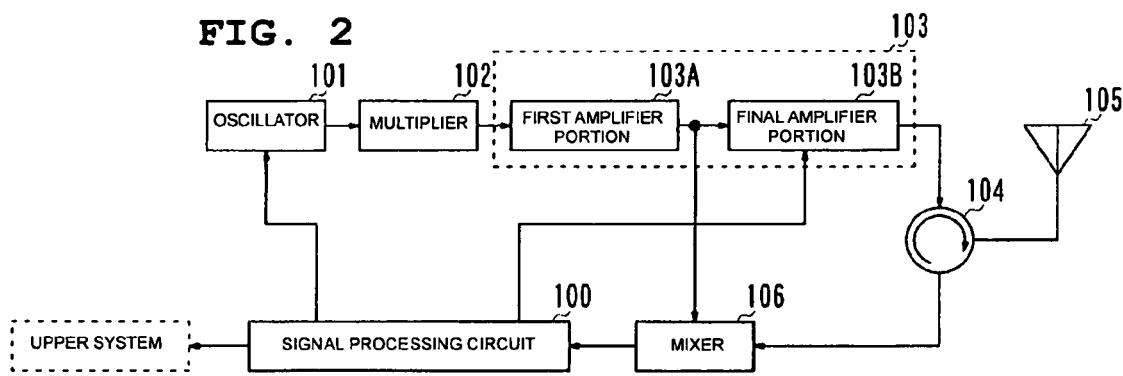
FIG. 2 is a block diagram showing the outline of the construction of a radar device according to a preferred second embodiment of the present invention.

FIG. 2 is a block diagram showing the outline of the structure of the amplitude pulse modulation radar device according to the present preferred embodiment.

An oscillator 101 oscillates at a desired fixed frequency in accordance with the modulation signal input from a signal processing circuit 100 and outputs the oscillation signal to a multiplier 102. The multiplier 102 multiplies the input oscillation signal so as to be a desired transmission frequency and outputs the transmission frequency signal to an amplifier 103. The amplifier 103 preferably includes a first amplifier portion 103A and a final amplifier portion 103B. The first amplifier portion 103A amplifies the input transmission frequency signal to a fixed amplitude level and outputs the signal to the final amplifier portion 103B and a mixer 106. Based on the gate bias control data signal from the signal processing circuit 100, the final amplifier portion 103B switches on and off the amplitude of the transmission frequency signal input from the first amplifier portion 103A to pulse modulate the signal and output the signal to a circulator 104. The circulator 104 transmits the input pulse modulation signal to an antenna 105, and the antenna 105 radiates the pulse modulation signal to a detection area. The antenna 105 receives a signal reflected from a target in the detection area and outputs the receiving signal to the circulator 104, and the circulator 104 transmits the receiving signal to the mixer. Based on the receiving signal input from the circulator 104 and the transmission frequency signal input from the amplifier 103, the mixer 106 outputs a detection signal in accordance with the amplitude of the receiving signal. The signal processing circuit 100 amplifies the input detection signal to a desired amplitude level and AD-converts the signal to output the detected data to an upper system. Furthermore, the signal processing circuit 100 calculates a time difference from the gate bias control data signal output by the signal processing circuit 100 and the input detection signal and calculates the distance to the detected target to output the calculated distance data to the upper system.

The above-described pulse modulation module including the FET amplifier is preferably used in the final amplifier portion 103B of such an amplitude pulse modulation radar device. Thus, it is able to radiate a stable high-output pulse modulation signal to a detection area and stably detect a target.

While the present invention has been described with respect to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the invention.

The invention claimed is:

1. An FET amplifier having an FET for amplifying a high-frequency signal to be input to the gate on the basis of a gate bias voltage from a gate bias control circuit, the gate bias control circuit comprising:
   a voltage stabilizing circuit that generates a positive DC constant voltage signal;
   a logical circuit that outputs a state control signal in a High state or in a Low state; and
   an inverting amplifier that receives a positive DC constant voltage signal input from the voltage stabilizing circuit at a non-inverting input portion of the inverting amplifier and receives the state control signal input from the logical circuit at an inverting input portion of the inverting amplifier to output the gate bias voltage.

2. The FET amplifier according to claim 1, wherein the gate bias control circuit generates a positive gate bias voltage when a state control signal from the logical circuit is in the Low state, and generates a negative gate bias voltage when a state control signal from the logical circuit is in the High state.

3. A pulse modulation module comprising the FET amplifier according to claim 1, wherein the pulse modulation module pulse-modulates a high-frequency signal input to the FET on the basis of the gate bias voltage.

4. A radar device comprising the pulse modulation module according to claim 3, wherein the radar device detects a target by externally transmitting a pulse modulation signal, which is produced by pulse-modulating a high-frequency signal in the pulse modulation module, and by receiving a reflection signal from the target.

* * * * *